(12) United States Patent
Cho et al.

(10) Patent No.: US 6,657,264 B2
(45) Date of Patent: Dec. 2, 2003

(54) LAYOUT METHOD OF LATCH-UP PREVENTION CIRCUIT OF A SEMICONDUCTOR DEVICE

(75) Inventors: Beak-Hyung Cho, Osan (KR); Choong-Keun Kwak, Suwon (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 0 days.

(21) Appl. No.: 09/940,733

(22) Filed: Aug. 28, 2001

(65) Prior Publication Data

US 2002/0130332 A1 Sep. 19, 2002

(30) Foreign Application Priority Data

Mar. 12, 2001 (KR) .......................... 2001-12526

(51) Int. Cl.[7] .......................... H01L 29/94; H01L 29/72
(52) U.S. Cl. .................. 257/372; 257/173; 257/373; 257/355; 257/360
(58) Field of Search .............................. 257/173, 355, 257/357, 360, 369, 372, 147, 27.063, 373

(56) References Cited

U.S. PATENT DOCUMENTS

| | | | | |
|---|---|---|---|---|
| 5,637,900 A | * | 6/1997 | Ker et al. .................. 257/355 |
| 5,804,861 A | * | 9/1998 | Leach ........................ 257/362 |
| 5,828,110 A | * | 10/1998 | Wollesen .................... 257/373 |
| 5,920,096 A | * | 7/1999 | Lee ............................. 257/355 |
| 6,028,341 A | * | 2/2000 | Tai et al. .................... 257/372 |
| 6,337,506 B2 | * | 1/2002 | Morishita et al. ........... 257/500 |

FOREIGN PATENT DOCUMENTS

| JP | 362188363 A | * | 8/1987 | .......... H01L/27/10 |
|---|---|---|---|---|
| JP | 2000-040751 | * | 8/2000 | ....... H01L/21/8238 |

* cited by examiner

Primary Examiner—Nathan J. Flynn
Assistant Examiner—Johannes Mondt
(74) Attorney, Agent, or Firm—F. Chau & Associates

(57) ABSTRACT

A layout method is provided for a latch-up prevention circuit of a semiconductor memory device which includes the steps of: arranging a cell array at substantially the middle of the device; placing peripheral circuits next to both sides of the cell array; placing a plurality of pads on both sides of the cell array between the peripheral circuits and both edges of the device; and arranging guard rings beneath the plurality of pads. The layout method further includes a plurality of ESD protection transistors disposed axially along the direction as the plurality of pads between the plurality of pads and an edge of the device. And each of guard ring is a NWELL guard ring, and connected to a supply voltage and ground.

12 Claims, 5 Drawing Sheets

LAYOUT METHOD OF LATCH-UP PREVENTION CIRCUIT OF A SEMICONDUCTOR DEVICE

BACKGROUND OF THE INVENTION

1. Field of the Invention

The present invention relates to a semiconductor memory device and a layout method and more particularly to a device and method of latch-up prevention in an electrostatic discharge (ESD) circuit of the semiconductor memory device.

2. Description of the Related Art

The reduction in size of semiconductor memory devices by very large scale integration has brought about reliability problems, such as electrostatic discharge (ESD), latch-up, oxide layer break down, etc. The structure of a bulk CMOS device has a parasitic bipolar junction transistor (BJT), which generally remains at a turn-off state but may be turned on by an external voltage change such as ESD or noise. Such condition is called a 'latch-up'. Latch-ups cause erroneous circuit operations and may cause circuit break-down. The frequency of latch-ups is low as long as there is no error in current design rules, for instance in the layout structure of a device. Latch-up is more of a problem when a gate oxide layer of the CMOS device gets thinner and a light doped drain (LLD) structure is utilized. ESD latch-up prevention technology is needed to ensure reliability of the device.

One ESD latch-up prevention circuit is constructed with transistors and a P+ guard ring which turn on to reduce positive/negative stress and exhaust ESD current. The prevention circuit includes a semiconductance controlled rectifier (SCR) having a PNPN structure artificially constructed as an ESD prevention circuit and used as a trigger circuit for operations of vertical and horizontal parasitic BJT, thereby exhausting ESD current. However, such circuit exhibits a weak latch-up characteristic due to the artificial construction of the SCR.

FIG. 1 shows a conventional layout of a main chip which includes a cell array 40 arranged in the main chip 100, an ESD prevention transistor 10 connected to a pad 20, and a peripheral circuit 30 neighboring the cell array 40. Generally, a guard ring (not shown in FIG. 1) should be disposed next to the peripheral circuit 30 to prevent latch-up. To better absorb carriers (holes or electrons) which cause latch-up, the guard ring should be larger. However, a large guard ring requires more chip real estate and compromises circuit density of the chip.

FIGS. 2 and 3 illustrate an ESD prevention circuit in connection with an input pad 20. The circuit has ESD prevention transistor 10 which is an NMOS transistor 10 disposed between the input pad 20 and an external input 1. FIG. 3 is a schematic view of FIG. 2. ESD can be prevented by a junction diode between NMOS drain 14 connected to the input pad 20 and P-type substrate (P-SUB) 11, and a lateral BJT between NMOS drain 13 and P-SUB 11. However, there is no reliable prevention means against latch-ups connected to the input pad 20.

FIG. 4 is an ESD prevention circuit having a SCR 50. FIG. 5 is a schematic view of FIG. 4. As shown in FIGS. 4 and 5, the pad 20 is simultaneously connected to a PN junction installed in a NWELL guard ring 60, and an NMOS drain 53 is connected to the pad 20 through the NWELL 60. A vertical PNP transistor is formed among PMOS 52, NWELL 60 and P-SUB 11, and a lateral NPN transistor among NWELL 60, P-SUB 11 and NMOS source 54. When ESD current flows to the circuit, the SCR 50 is turned on by a voltage drop across resistance Rw so as to sufficiently exhaust the ESD current. However, a disadvantage of the SCR 50 is a weak latch-up characteristic.

A need therefore exists for a semiconductor device for effectively solving the aforementioned problems.

SUMMARY OF THE INVENTION

A layout method of a latch-up prevention circuit of a semiconductor memory device is provided which includes the steps of: arranging a plurality of pads at an edge of the device; and arranging a guard ring beneath the plurality of pads.

According to an aspect of the invention, the layout method further includes a plurality of ESD protection transistors disposed axially along the direction as the plurality of pads and between the plurality of pads and the edge of the device, and the guard ring is connected to the edge of the device along the parallel direction as the plurality of pads.

A layout method of a latch-up prevention circuit of a semiconductor memory device is provided which includes the steps of: arranging a cell array at substantially the middle of the device; placing peripheral circuits next to both sides of the cell array; placing a plurality of pads on both sides of the cell array between the peripheral circuits and both edges of the device; and arranging guard rings beneath the plurality of pads.

According to an aspect of the invention, the layout method further includes a plurality of ESD protection transistors along the parallel direction as the plurality of pads between the plurality of pads and an edge of the device, and the guard ring is connected to an edge of the device along the parallel direction as the plurality of pads.

A semiconductor memory device is provided which includes: a cell array disposed substantially at the middle of the device; a plurality of peripheral circuits disposed next to both sides of the cell array; a plurality of pads disposed at all sides of the cell array between the peripheral circuits and edges of the device; and guard rings disposed beneath the plurality of pads.

According to an aspect of the invention, the device further includes a plurality of ESD protection transistors disposed axially along the axial direction as the plurality of pads and between the plurality of pads and an edge of the device, and each of the guard rings is connected each other.

According to an aspect of the invention, each of the guard rings is a NWELL guard ring, and connected to one of a supply voltage and ground.

BRIEF DESCRIPTION OF THE DRAWINGS

The advantages of the present invention will become apparent by describing in detail preferred embodiments thereof with reference to the attached drawings in which.

DETAILED DESCRIPTION OF PREFERRED EMBODIMENTS

Figure 1:
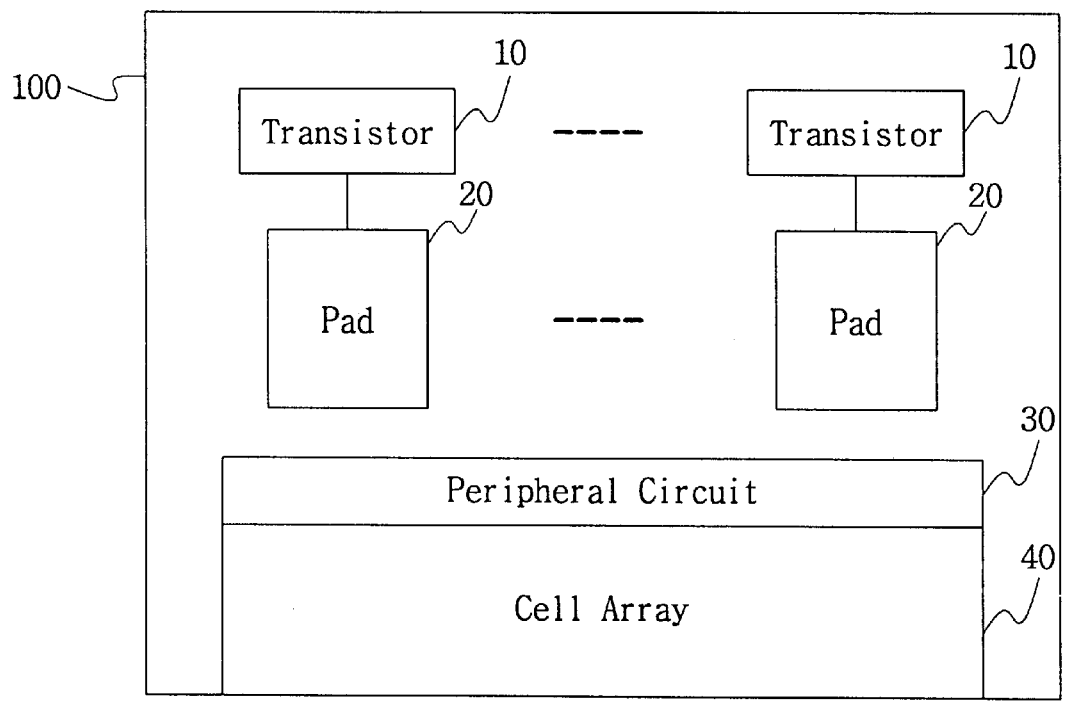
FIG. 1 is a conventional layout of a main chip.
Figure 2:
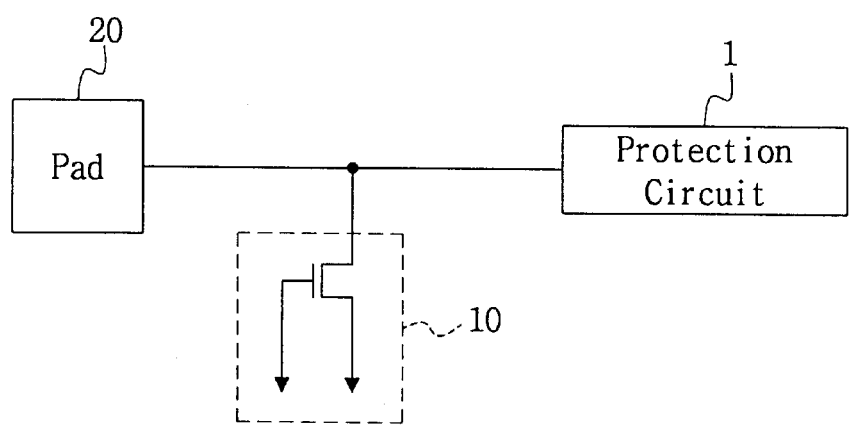
FIG. 2 illustrates an ESD prevention circuit having an input pad according to a conventional invention.
Figure 3:
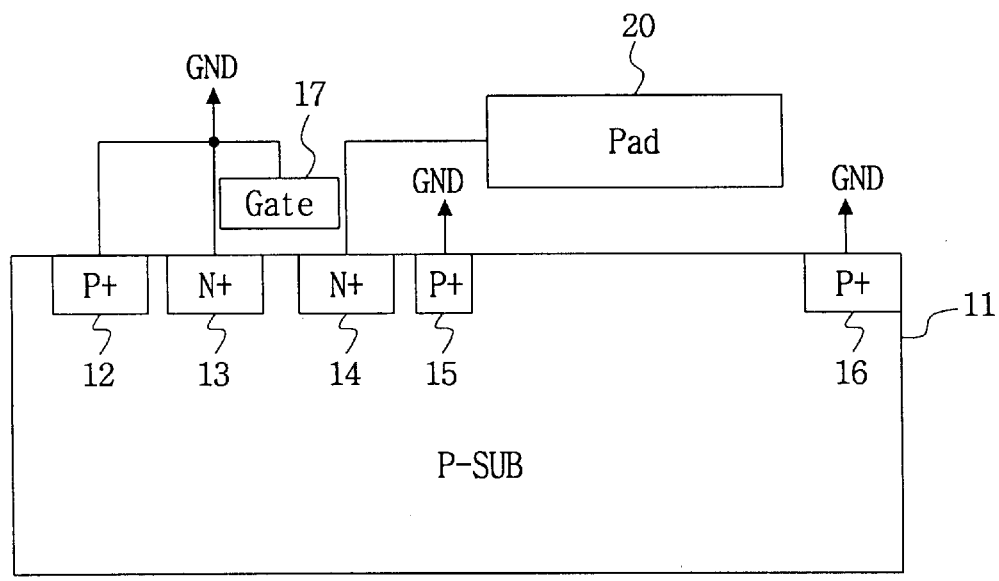
FIG. 3 is a schematic view of FIG. 2.
Figure 4:
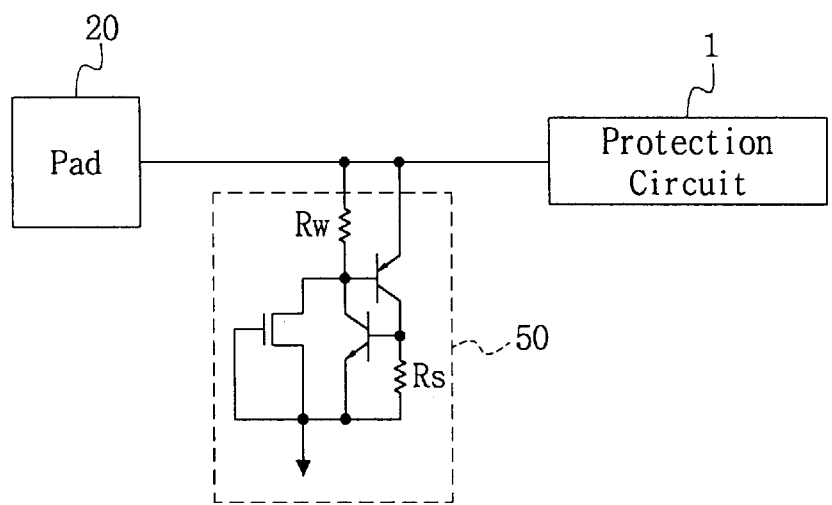
FIG. 4 illustrates a conventional ESD prevention circuit having a semi-conductance controlled rectifier (SCR)
Figure 5:
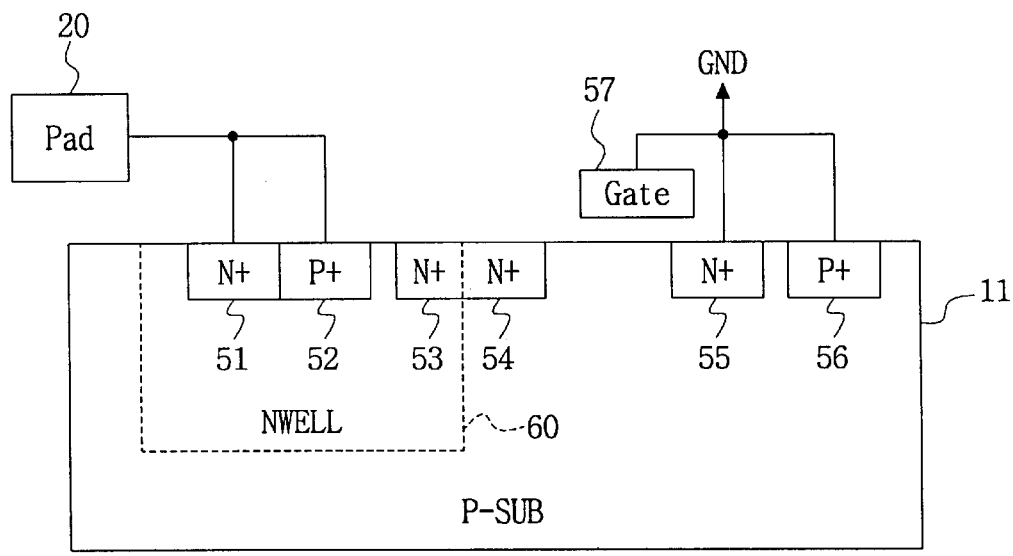
FIG. 5 is a schematic view of FIG. 4.

Hereinafter, the present invention will be described in detail with reference to the accompanying drawings of FIGS. 6 through 9. It should be noted that like reference numerals are used through the accompanying drawings for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures to clarify key points of the present invention.

Figure 6:
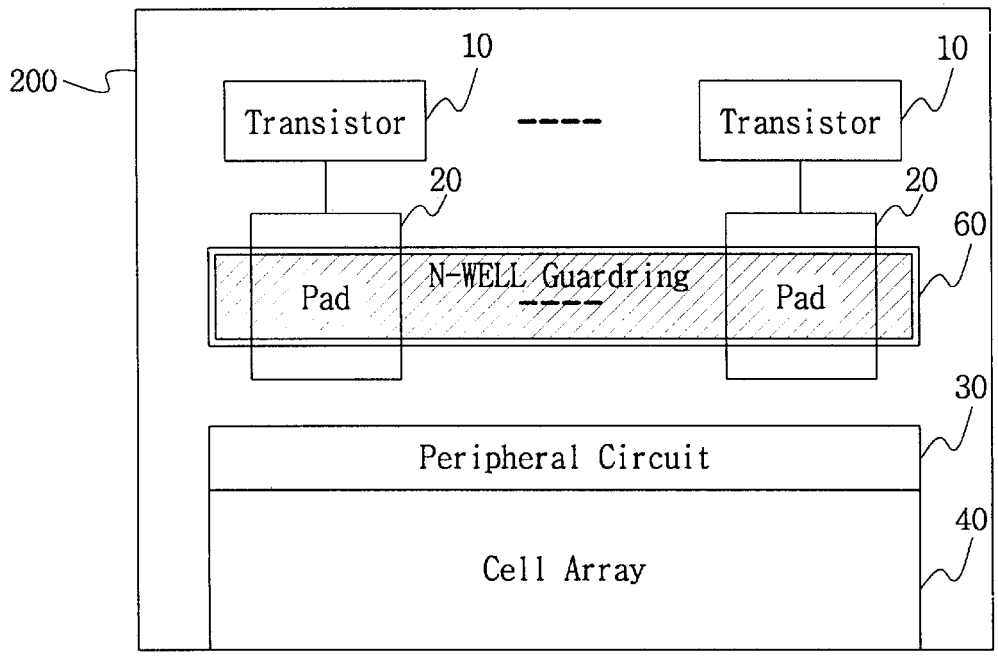
FIG. 6 is a layout of a main chip according to a preferred embodiment of the present invention.

FIG. 6 is a layout view of a main chip according to a preferred embodiment of the present invention. Referring to FIG. 6, a cell array 40 is arranged in the main chip 200, a peripheral circuit 30 is disposed next to the cell array 40, a plurality of pads 20 for connecting external pins of semiconductor package are disposed between the peripheral circuit 30 and a plurality of transistors 10, and the plurality of transistors 10 are connected to the plurality of pads along the parallel direction as the plurality of pads between the plurality of pads 20 and the edge of the main chip. And a guard ring 60 is disposed beneath the pads 20 as a means of preventing latch-ups.

According to a preferred embodiment of the present invention, a number of the pads 20 are as same as a number of external pins of package. The guard ring 60 is a NWELL guard ring and can be connected to both edges of the main chip 200 axially along the direction as the plurality of pads.

The layout structure of a semiconductor device in the present invention will be described in detail with reference to FIG. 7 which is a cross-sectional view of A–A' in FIG. 6.

Figure 7:
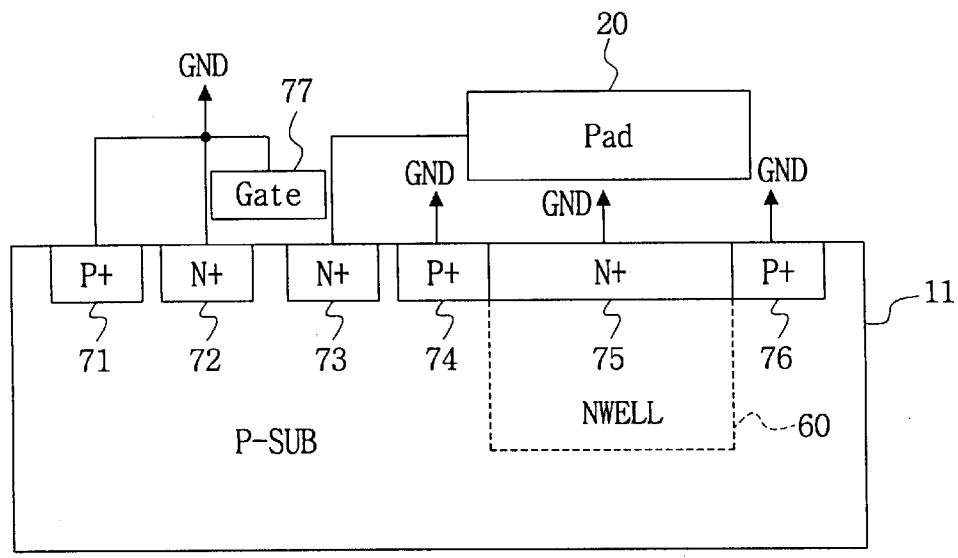
FIG. 7 is a cross-sectional schematic view of FIG. 6.

Referring to FIG. 7, a NMOS drain 73 of an ESD preventing NMOS transistor is connected to the pad 20, and a gate 77 and a NMOS source 72 are connected to ground GND. Furthermore, PMOS guard rings 71 and 76 are positioned at both sides of a P-type substrate 11, and are connected to the ground GND. An NWELL guard ring 60 is positioned beneath the pad 20, and the NWELL guard ring 60 is connected to a NMOS active region 75. The NMOS active region 75 connected to the ground GND is positioned between the pad 20 and the NWELL 60, and connected with neighboring PMOS guard rings 74 and 76. Accordingly, PN junctions are formed between NMOS active region 75 and PMOS guard ring 74, and are formed between NMOS active region 75 and PMOS guard ring 76. Since any kind of PMOS does not exist in the NWELL guard ring 60, vertical parasitic BJT cannot be formed, and only lateral parasitic BJT can be formed. And also only lateral parasitic BJT is formed between the source 72 of the NMOS ESD prevention transistor and the substrate P-SUB 11. Lateral parasitic BJT is formed among the NMOS drain 73 of the ESD prevention transistor, the substrate P-SUB 11 and the NWELL guard ring 60. And a junction diode is formed between the NMOS drain 73 of the ESD prevention transistor and the substrate the P-type substrate P-SUB 11, and is formed between the NWELL guard ring 60 and the P-type substrate 11. Accordingly, when the ESD stress shifts to the pad 20, some carrier shifting from outside is absorbed by the NWELL guard ring 60 before being further induced to the cell array 40 (FIG. 6). Thus, the amount of carriers generated from ESD flowing into the cell array 40 (FIG. 6) is reduced, and a possibility of latch-up is reduced as well.

On the other hand, even though the NWELL guard ring 60 is explained by connecting to a NMOS active region 75, the NWELL guard ring 60 can be connected to all of the upper layers connected to a supply voltage or ground.

Figure 8:
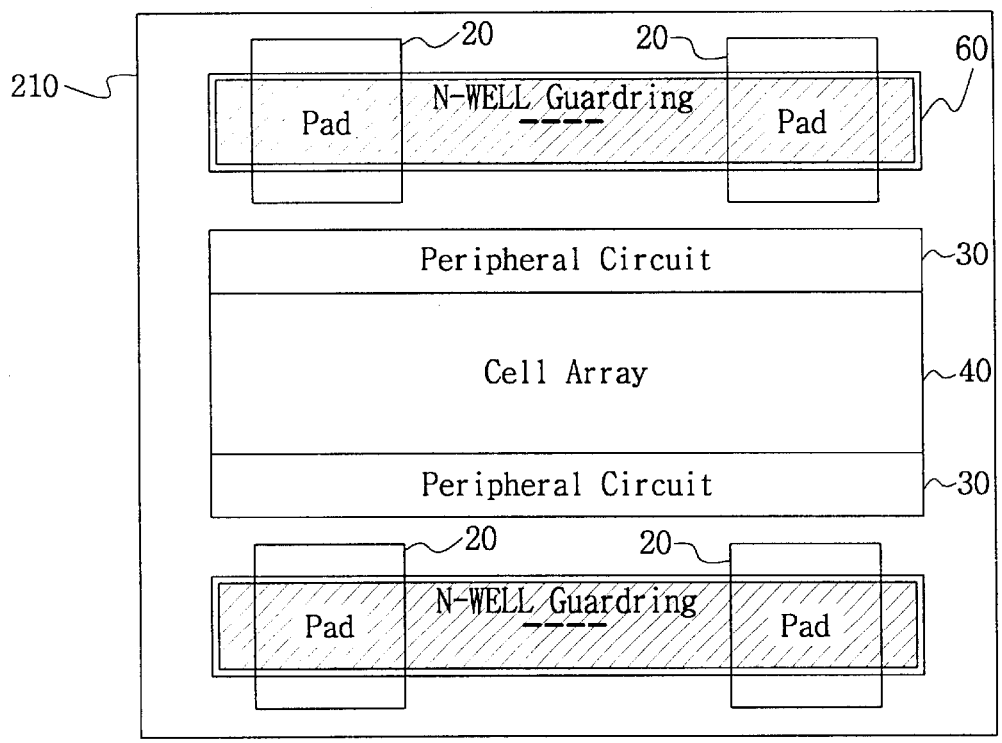
FIG. 8 is a layout of a main chip according to another embodiment of the present invention.

FIG. 8 is a layout of a main chip 210 according to another embodiment of the present invention. Referring to FIG. 8, a cell array 40 is disposed substantially at the middle of the main chip 210, a plurality of peripheral circuits 30 are disposed next to both sides of the cell array 30. A plurality of pads 20 for connecting external pins of semiconductor package are disposed at both sides of the cell array 40 between the peripheral circuits 30 and edge of the main chip 210. And guard rings 60 are disposed beneath the pads 20 as a means of preventing latch-ups.

According to a preferred embodiment of the present invention, a plurality of ESD protection transistors (not shown in FIG. 8) further includes in the main chip 210 disposed axially along the axial direction as the plurality of pads 20 and between the plurality of pads 20 and the edges of the main chip 210.

According to a preferred embodiment of the present invention, a number of the pads 20 are as same as a number of external pins of package. Each of the guard rings 60 is a NWELL guard ring and can be connected to the both edge of the main chip 200.

A cross-sectional view of the pad 20 and peripheral of the pad 20 of FIG. 8 is same as the FIG. 7. Thus, detailed explanation of the A cross-sectional view is omitted.

Figure 9:
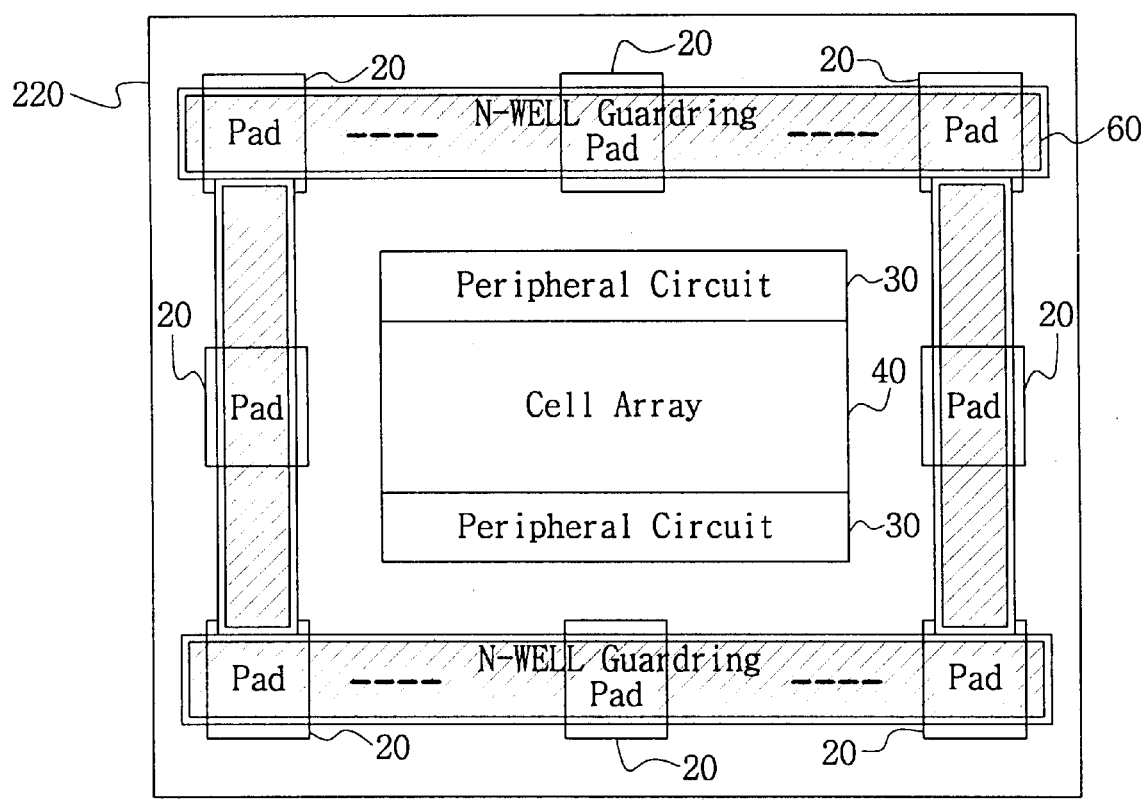
FIG. 9 is a layout of a main chip according to another embodiment of the present invention.

FIG. 9 is a layout view of a main chip 220 according to another embodiment of the present invention. Referring to FIG. 9, a cell array 40 is disposed substantially at the middle of the main chip 220, peripheral circuits 30 are disposed next to both sides of the cell array 40. A plurality of pads 20 are disposed at all sides of the cell array 40 between the peripheral circuits 30 and edges of the main chip 220. Guard rings 60 are disposed beneath the pads 20 along the edge of the main chip 220 as a means of preventing latch-ups.

According to a preferred embodiment of the present invention, a plurality of ESD protection transistors (not shown in FIG. 9) further includes in the main chip 220 disposed axially along the axial direction as the plurality of pads 20 and between the plurality of pads 20 and the edges of the main chip 220.

According to a preferred embodiment of the present invention, a number of the pads 20 are as same as a number of external pins of package. Each of the guard rings 60 is a NWELL guard ring and can be connected each other.

A cross-sectional view of the pad 20 and peripheral of the pad 20 of FIG. 9 is same as the FIG. 7. Thus, detailed explanation of the A cross-sectional view is omitted.

As described above, the guard ring is arranged beneath the pads in the layout of a semiconductor device to thereby efficiently prevent latch-ups and reduce the size of a chip.

Furthermore, ESD protection transistors are positioned between pad and an edge of a chip to thereby effectively prevent ESD and latch-ups.

While the invention has been described in terms of a single preferred embodiment, those skilled in the art will recognize that the invention can be practiced with modification within the spirit and scope of the appended claim.

What is claimed is:

1. A layout method of a latch-up prevention circuit of a semiconductor memory device, comprising the steps of:
   arranging a plurality of pads at an edge of the device;
   arranging a guard ring formed of NWELL beneath the plurality of pads;
   arranging an NMOS active region between each of the plurality of pads and the guard ring; and
   arranging two PMOS guard rings disposed at both sides of the NMOS active region, each PMOS guard ring directly contacting the NMOS active region to form PN junctions.

2. The layout method, as defined in claim 1, further comprising a plurality of ESD protection transistors disposed axially along the direction of alignment of the plurality of pads and between the plurality of pads and the edge of the device.

3. The layout method, as defined in claim 1, wherein the guard ring is connected to the edge of the device along the parallel direction of alignment of the plurality of pads.

4. The method, as defined in claim 1, wherein the guard ring is connected to either a supply voltage or ground.

5. A layout method of a latch-up prevention circuit of a semiconductor memory device comprising the steps of:
   arranging a cell array at substantially the middle of the device;
   placing peripheral circuits next to both sides of the cell array;
   placing a plurality of pads on both sides of the cell array between the peripheral circuits and both edges of the device;
   arranging guard rings formed of NWELL beneath the plurality of pads;
   arranging an NMOS active region between each of the plurality of pads and each of the guard rings; and
   arranging two PMOS guard rings disposed at both sides of the NMOS active region, each PMOS guard ring directly contacting the NMOS active region to form PN junctions.

6. The layout method, as defined in claim 5, further comprising a plurality of ESD protection transistors along the parallel direction of alignment of the plurality of pads between the plurality of pads and an edge of the device.

7. The layout method, as defined in claim 5, wherein each of the guard is connected to an edge of the device along the parallel direction of alignment of the plurality of pads.

8. The method, as defined in claim 5, wherein each of the guard rings is connected to either a supply voltage or ground.

9. A semiconductor memory device having a latch-up prevention circuit, comprising:
   a cell array disposed substantially at the middle of the device;
   a plurality of peripheral circuits disposed next to both sides of the cell array;
   a plurality of pads disposed at all sides of the cell array between the peripheral circuits and edges of the device; and
   guard rings formed of NWELL beneath the plurality of pads;
   an NMOS active region between each of the plurality of pads and each of the guard rings; and
   two PMOS guard rings disposed at both sides of the NMOS active region, each PMOS guard ring directly contacting the NMOS active region to form PN junctions.

10. The device of claim 9, further comprising a plurality of ESD protection transistors disposed axially along the axial direction of alignment of the plurality of pads and between the plurality of pads and an edge of the device.

11. The device of claim 9, wherein each of the guard rings is connected each other.

12. The device of claim 9, wherein each of the guard rings is connected to either a supply voltage or ground.

* * * * *